United States Patent
Savo et al.

(10) Patent No.: US 10,141,902 B1
(45) Date of Patent: Nov. 27, 2018

(54) APPARATUS FOR AND METHOD OF GENERATING OUTPUT SIGNAL BASED ON DETECTED LOAD RESISTANCE VALUE

(71) Applicant: Marvell World Trade Ltd, St. Michael (BB)

(72) Inventors: Alessandro Savo, Pavia (IT); Andrea Lombardi, Pavia (IT); Giuseppe De Vita, Pavia (IT); Alberto Ressia, Viguzzolo (IT)

(73) Assignee: MARVELL WORLD TRADE LTD., St. Michael (BM)

( * ) Notice: Subject to any disclaimer, the term of this patent is extended or adjusted under 35 U.S.C. 154(b) by 0 days.

(21) Appl. No.: 15/200,783

(22) Filed: Jul. 1, 2016

Related U.S. Application Data (60) Provisional application No. 62/189,869, filed on Jul. 8, 2015, provisional application No. 62/301,913, filed on Mar. 1, 2016.

(51) Int. Cl.
| | |
|---|---|
| *H03G 3/00* | (2006.01) |
| *H03G 3/30* | (2006.01) |
| *H04R 29/00* | (2006.01) |

(52) U.S. Cl.
CPC .......... *H03G 3/001* (2013.01); *H03G 3/3005* (2013.01); *H04R 29/00* (2013.01); *H04R 2420/05* (2013.01)

(58) Field of Classification Search
CPC .. H04R 1/1041; H04R 1/1033; H04R 1/1091; H04R 3/007; H04R 5/04; H04R 5/033; H04R 29/001; H04R 29/004; H04R 2420/05; H04R 2420/09; H04R 2201/107; H04R 2499/11; H04R 2420/03; H04R 3/00; H04R 2420/01; H04M 1/6058; H04M 1/72527; H04M 1/03; H04M 1/0258; H04M 1/0254; H04M 2250/12; H04M 1/0274; G01R 31/041; G01R 31/043; G01R 31/318572; H03G 3/348
See application file for complete search history.

(56) References Cited

U.S. PATENT DOCUMENTS

| | | | | |
|---|---|---|---|---|
| 6,069,960 | A * | 5/2000 | Mizukami | H04R 5/04 381/120 |
| 7,668,308 | B1 * | 2/2010 | Wurtz | H04R 3/00 379/430 |
| 8,682,003 | B2 * | 3/2014 | Terlizzi | G02B 6/3817 381/74 |
| 8,817,994 | B2 * | 8/2014 | Turner | H03K 5/1254 381/123 |

(Continued)

FOREIGN PATENT DOCUMENTS

| | | | | |
|---|---|---|---|---|
| GB | 2509316 A * | 7/2014 | | G06F 11/3051 |

*Primary Examiner* — Yogeshkumar Patel (57) ABSTRACT

Aspects of the disclosure provide an apparatus having a first connector and a signal processing circuit. The first connector is configured to receive a second connector so that connecting terminals at respective portions of the first and second connectors are coupled together. The signal processing circuit is configured to generate a first output signal at a first amplification gain, determine a first load resistance value at a first connecting terminal of the second connector that is configured to receive the first output signal when coupled to the first connector, and set the first amplification gain based on the first load resistance value.

20 Claims, 6 Drawing Sheets

(56) References Cited

U.S. PATENT DOCUMENTS

| | | | |
|---|---|---|---|
| 8,829,932 B2* | 9/2014 | Turner | G01R 31/2844 324/750.3 |
| 9,219,476 B2* | 12/2015 | Inha | H03K 17/687 |
| 9,277,320 B1* | 3/2016 | Hoskins | H04R 5/033 |
| 9,313,595 B1* | 4/2016 | Jain | H04R 29/00 |
| 9,699,542 B2* | 7/2017 | Wismar | H04R 1/1041 |
| 9,699,545 B1* | 7/2017 | Jain | H04R 1/1041 |
| 2004/0081099 A1* | 4/2004 | Patterson | G06F 13/4081 370/241 |
| 2007/0263750 A1* | 11/2007 | Ou | H04M 1/72527 375/315 |
| 2009/0111336 A1* | 4/2009 | Johansson | H01R 23/26 439/884 |
| 2009/0175456 A1* | 7/2009 | Johnson | H04R 5/04 381/1 |
| 2009/0179883 A1* | 7/2009 | Goodart | G09G 5/006 345/211 |
| 2010/0104119 A1* | 4/2010 | Lan | H04R 5/04 381/309 |
| 2010/0215183 A1* | 8/2010 | Hansson | H04R 1/1033 381/58 |
| 2010/0240260 A1* | 9/2010 | Kao | H04M 1/6058 439/668 |
| 2010/0260341 A1* | 10/2010 | Sander | H04R 1/1041 381/1 |
| 2010/0260361 A1* | 10/2010 | Yamkovoy | H04R 1/1033 381/309 |
| 2011/0099298 A1* | 4/2011 | Chadbourne | G06F 13/102 710/10 |
| 2011/0112666 A1* | 5/2011 | McFarland | G06F 3/162 700/94 |
| 2011/0116675 A1* | 5/2011 | Terlizzi | G02B 6/3817 381/384 |
| 2011/0116747 A1* | 5/2011 | Terlizzi | G02B 6/3817 385/75 |
| 2011/0116750 A1* | 5/2011 | Terlizzi | G02B 6/3817 385/88 |
| 2012/0200172 A1* | 8/2012 | Johnson | H04R 29/001 307/116 |
| 2012/0308041 A1* | 12/2012 | Birch | H03K 17/56 381/94.1 |
| 2012/0328116 A1* | 12/2012 | Bidmead | H04R 29/004 381/59 |
| 2013/0058494 A1* | 3/2013 | Kim | H03G 3/301 381/74 |
| 2013/0064381 A1* | 3/2013 | Jeong | H04R 5/04 381/58 |
| 2013/0108063 A1* | 5/2013 | Verhoeve | G01R 31/31701 381/58 |
| 2013/0108064 A1* | 5/2013 | Kocalar | G01R 31/318572 381/58 |
| 2013/0156216 A1* | 6/2013 | Shah | H04R 5/04 381/74 |
| 2013/0223641 A1* | 8/2013 | Lin | H04M 1/72527 381/77 |
| 2013/0259255 A1* | 10/2013 | Schul | H04R 1/1041 381/74 |
| 2013/0278205 A1* | 10/2013 | Mullins | G06F 21/44 320/107 |
| 2013/0305066 A1* | 11/2013 | Mullins | G06F 1/266 713/310 |
| 2013/0315276 A1* | 11/2013 | Segal | G01K 7/22 374/1 |
| 2013/0343561 A1* | 12/2013 | Johnson | H01R 13/703 381/74 |
| 2014/0003616 A1* | 1/2014 | Johnson | H04R 29/001 381/74 |
| 2014/0029770 A1* | 1/2014 | Chien | H04R 3/00 381/123 |
| 2014/0038460 A1* | 2/2014 | Lee | H04R 29/004 439/620.01 |
| 2014/0050330 A1* | 2/2014 | Allen | H04R 3/00 381/74 |
| 2014/0100001 A1* | 4/2014 | Im | H04M 1/6058 455/570 |
| 2014/0105432 A1* | 4/2014 | Jing | H04R 5/04 381/309 |
| 2014/0223037 A1* | 8/2014 | Minoo | G06F 1/1632 710/16 |
| 2014/0277643 A1* | 9/2014 | Villarreal | G06F 17/3074 700/94 |
| 2015/0055789 A1* | 2/2015 | Bernal Castillo | G10K 11/178 381/71.6 |
| 2015/0055793 A1* | 2/2015 | Toda | H04R 25/556 381/74 |
| 2015/0078577 A1* | 3/2015 | Cimaz | H04R 29/001 381/74 |
| 2015/0261641 A1* | 9/2015 | Kim | H04R 29/004 710/16 |
| 2015/0304769 A1* | 10/2015 | Weijand | H04R 1/1041 381/123 |
| 2015/0382104 A1* | 12/2015 | Hogan | H04R 3/00 381/71.7 |
| 2016/0100243 A1* | 4/2016 | Wismar | H04R 1/1041 381/74 |
| 2016/0127828 A1* | 5/2016 | Maher | H04R 5/04 381/94.1 |
| 2016/0142810 A1* | 5/2016 | Freitas | H04R 1/1041 381/74 |
| 2016/0227018 A1* | 8/2016 | Lee | H04M 1/72527 |
| 2016/0246747 A1* | 8/2016 | Rand | G06F 13/385 |
| 2016/0269813 A1* | 9/2016 | Chen | H04R 29/001 |
| 2016/0269844 A1* | 9/2016 | Ding | H04R 1/1041 |
| 2016/0309271 A1* | 10/2016 | Poulsen | H04R 29/001 |
| 2016/0330537 A1* | 11/2016 | Barrentine | H04R 1/1041 |
| 2016/0365082 A1* | 12/2016 | Poulsen | G10K 11/1786 |
| 2016/0380394 A1* | 12/2016 | Park | H04R 5/04 439/620.21 |
| 2017/0019725 A1* | 1/2017 | Zhao | H04R 1/1041 |
| 2017/0153347 A1* | 6/2017 | Saunders | H01R 24/58 |
| 2017/0180528 A1* | 6/2017 | Ekner | H04M 1/2473 |
| 2017/0180859 A1* | 6/2017 | Lesso | H04R 3/12 |
| 2017/0245052 A1* | 8/2017 | Howlett | H04R 3/00 |
| 2018/0027330 A1* | 1/2018 | Rand | G06F 13/387 |

* cited by examiner

APPARATUS FOR AND METHOD OF GENERATING OUTPUT SIGNAL BASED ON DETECTED LOAD RESISTANCE VALUE

INCORPORATION BY REFERENCE

This present disclosure claims the benefit of U.S. Provisional Application No. 62/189,869, "Method and Apparatus for Audio Plug Mic/Ground Position Detection" filed on Jul. 8, 2015, and U.S. Provisional Application No. 62/301,913, "METHOD AND APPARATUS FOR AUDIO PLUG MIC/GROUND POSITION AND LOAD DETECTION," filed on Mar. 1, 2016, which are incorporated herein by reference in their entireties.

FIELD

This disclosure relates generally to an apparatus and a method for providing an output signal to a connecting terminal of a connector. More specifically, the disclosure relates to an apparatus and a method for adjusting an amplification gain based on a detected load resistance value of a connector and providing an output signal to a connecting terminal of the connector at the amplification gain.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

In many applications, an electronic device may have a connector suitable to receive various different but yet still compatible types of connectors that have different connecting configurations (e.g., numbers, positions, and/or dimensions of the connecting portions of the connectors) or connecting assignments (e.g., pinouts of the connectors). Also, in many applications, two peripherals that have connectors adopting the same connecting configuration and the same connecting assignment may still have different electrical characteristics at corresponding connecting portions. For example, headsets or headphones may be equipped with connectors (e.g., audio plugs) that have different connecting configurations. Also, two headphones may have different speaker impedance ratings, e.g., 4-ohms, 6-ohms, or 8-ohms, even when they are equipped with connectors that have the same connecting configuration and the same connecting assignment.

SUMMARY

Aspects of the disclosure provide an apparatus that includes a first connector and a signal processing circuit. The first connector is configured to receive a second connector so that connecting terminals at respective portions of the first and second connectors are coupled together. The signal processing circuit is configured to generate a first output signal at a first amplification gain, determine a first load resistance value at a first connecting terminal of the second connector that is configured to receive the first output signal when coupled to the first connector, and set the first amplification gain based on the first load resistance value.

In an embodiment, the signal processing circuit includes a signal generation circuit and a controller. The signal generation circuit is configured to generate the first output signal at the first amplification gain and output the first output signal to the first connector. The controller is configured to determine the first load resistance value, and set the first amplification gain based on the first load resistance value.

In an embodiment, the first connector comprises a first connecting terminal to which the first output signal is output, and the first connecting terminal of the first connector is electrically coupled with the first connecting terminal of the second connector when the first connector is coupled to the second connector.

In an embodiment, the signal generation circuit is further configured to generate a second output signal at a second amplification gain and output the second output signal to the first connector. The first connector further includes a second connecting terminal to which the second output signal is output, and the second connecting terminal of the first connector is electrically coupled with a second terminal of the second connector when the first connector is coupled to the second connector. In an embodiment, the controller is further configured to determine a second load resistance value at the second connecting terminal of the second connector, and set the second amplification gain based on the second load resistance value.

In an embodiment, the signal generation circuit includes a digital-to-analog converter (DAC) configured to generate an analog signal based on a digital signal and an analog amplifier configured to generate the first output signal based on the analog signal from the DAC. The signal processing circuit is configured to set the first amplification gain by setting at least one of a first parameter applicable to the DAC and a second parameter applicable to the analog amplifier.

Aspects of the disclosure provide an apparatus that includes an audio jack configured to receive an audio plug; an insertion detector configured to detect insertion of the audio plug into the audio jack; a signal generation circuit; and a controller. The signal generation circuit is electrically coupled with a first connecting terminal of the audio jack and configured to generate a first output signal to be output to the first connecting terminal of the audio jack based on a set of settings. The controller is configured to, in response to detection of the insertion of the audio plug into the audio jack, determine a first resistance value at the first connecting terminal of the audio jack, and adjust the set of settings of the signal generation circuit based on the first resistance value.

In an embodiment, the signal generation circuit is electrically coupled with a second connecting terminal of the audio jack and configured to generate a second output signal to be output to the second connecting terminal of the audio jack based on the set of settings. The controller is further configured to, in response to the detection of the insertion of the audio plug into the audio jack, determine a second resistance value at the second connecting terminal of the audio jack, and adjust the set of settings of the audio signal generation circuit based on the second resistance value.

Aspects of the disclosure provide a method that includes detecting establishment of a connection between a first connector and a second connector, the first connector being configured to receive the second connector so that connecting terminals at respective portions of the first and second connectors are coupled together; in response to detecting the establishment of the connection between the first and second connectors, determining a first load resistance value at a first connecting terminals of the second connector that is configured to receive a first output signal when coupled to a first connecting terminal of the first connector, and adjusting a first amplification gain based on the first load resistance value; and generating the first output signal at the first amplification gain.

In an embodiment, the method further includes, in response to detecting the establishment of the connection between the first and second connectors, determining a second load resistance value at a second connecting terminals of the second connector that is configured to receive a second output signal when coupled to a second connecting terminal the first connector, and adjusting a second amplification gain based on the second load resistance value; and generating the second output signal at the second amplification gain.

BRIEF DESCRIPTION OF THE DRAWINGS

Various embodiments of this disclosure serve as examples and will be described in detail with reference to the following figures, wherein like numerals reference like elements, wherein.

DETAILED DESCRIPTION OF EMBODIMENTS

Figure 1:
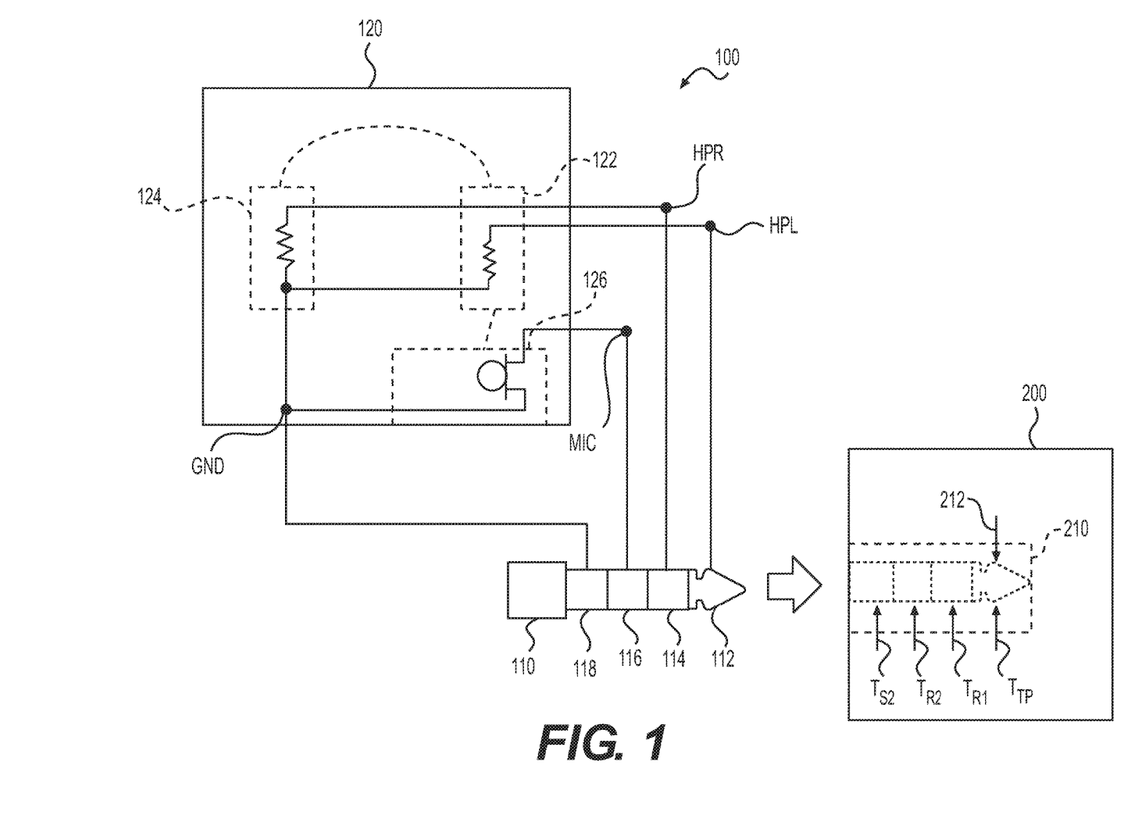
FIG. 1 shows an example functional block diagram of a peripheral and an apparatus that are configured to be electrically coupled with each other through matching connectors according to an embodiment of the disclosure.

FIG. 1 shows an example functional block diagram of a peripheral 100 and an apparatus 200 that are configured to be electrically coupled with each other through matching connectors 110 and 210 according to an embodiment of the disclosure.

In the embodiment depicted in FIG. 1, a peripheral 100 includes a first connector 110, such as an audio plug, and an apparatus 200, for example a computer or media player, including a second connector 210, such as an audio jack. As shown, the peripheral 100 is capable of being electrically coupled to the apparatus 200 via the first and second connectors 110 and 210. Also, in the embodiments depicted in FIG. 1, the peripheral 100 includes components 120 that, for example, constitute a headset. In alternative examples, the components 120 are configured to be other devices such as a speaker, a microphone, or the like. Also, the apparatus 200 includes components outside the connector 210 that collectively are referred to as a signal processing circuit (not shown). In some examples, the signal processing circuit of the apparatus 200 is configured to drive a microphone to receive an audio input signal, or drive one or more speakers of the peripheral 100 when the peripheral 100 is connected to the apparatus 200 through the connectors 110 and 210.

The peripheral 100, the apparatus 200, the audio plug 110, and the audio jack 210 are illustrated as a non-limiting example. In some examples, the connectors 110 and 210 are other types of connectors, where one connector is configured to receive the other connector so that connecting terminals at respective portions of the connectors are coupled together in order to electrically couple the peripheral 100 with the apparatus 200. In some examples, the connectors 110 and 210 are matched connectors that are configured to carry audio signals or multimedia signals in analog form.

As shown, various portions of the audio plug 110 correspond to four connecting positions, including a tip connecting portion 112, a first ring connecting portion 114, a second ring connecting portion 116, and a sleeve connecting portion 118. In some examples according to a 4-pole configuration, the audio plug 110 has four separate connecting terminals that are disposed at each one of the four connecting portions 112-118, respectively. In other examples according to a 3-pole configuration, the audio plug 110 has three separate connecting terminals, where two separate connecting terminals are disposed at the tip connecting portion 112 and the first ring connecting portion 114, and the other connecting terminal extends through the second ring connecting portion 116 and the sleeve connecting portion 118. In some examples according to a 2-pole configuration, the audio plug 110 has two separate connecting terminals, where one connecting terminal is disposed at the tip connecting portion 112, and the other one connecting terminal extends through the first ring connecting portion 114, the second ring connecting portion 116, and the sleeve connecting portion 118.

In some examples, the components 120 of the peripheral 100 electrically connect the connecting portions of the audio plug 110 in various ways such that an audio plug that is designed for a 4-pole configuration audio plug is adapted to be used as a 3-pole configuration audio plug or a 2-pole configuration audio plug; or an audio plug that is designed for a 3-pole configuration audio plug is adapted to be used as a 2-pole configuration audio plug. In some examples according to the present application, the 2-pole configuration is processed as the 3-pole configuration.

As a non-limiting example, in FIG. 1, the components 120 form a stereo headset that includes a left ear speaker 122, a right ear speaker 124, and a microphone 126. The left ear speaker 122 functions as a load resistive device coupled between a left driving node (labeled as "HPL") and a ground reference node (labeled as "GND"). The right ear speaker 124 functions as a load resistive device coupled between a right driving node (labeled as "HPR") and the ground reference node GND. The speaker 126 is coupled between a microphone bias/signal node (labeled as "MIC") and the ground reference node GND. In this example, the audio plug 110 has a 4-pole configuration, where the left driving node HPL is coupled with the connecting terminal at the tip connecting portion 112; the right driving node HPR is coupled with the connecting terminal at the first ring connecting portion 114; the microphone bias/signal node MIC is coupled with the connecting terminal at the second ring connecting portion 116; and the ground reference node GND is coupled with the connecting terminal at the sleeve connecting portion 118.

Some different combinations of the components 120 and the connecting portions of the audio plug 110 are listed in Table I as a non-limiting example. The peripheral 100 in FIG. 1 falls in Case 2 in Table I. The denotation "Float" in Table I indicates that a connecting terminal at the corresponding connecting position is absent or not connected to form a complete electrical path from a power source to a reference ground (also referred to as "electrically floating"). Also, in some examples, Case 13 in Table I is implemented as either a 3-pole audio plug or a 2-pole audio jack. Other variations are within the contemplated embodiments of the present disclosure.

TABLE I

| Case | # of poles | Example Peripheral | Tip Portion | Ring 1 Portion | Ring 2 Portion | Sleeve Portion |
|---|---|---|---|---|---|---|
| 1 | 4 poles | Stereo Headset | HPL | HPR | GND | MIC |
| 2 | | | HPL | HPR | MIC | GND |
| 3 | | Mono Headset | HPL | GND | GND | MIC |
| 4 | | | HPL | HPL | GND | MIC |
| 5 | | | HPL | Float | GND | MIC |
| 6 | | | HPL | GND | MIC | GND |
| 7 | | | HPL | HPL | MIC | GND |
| 8 | | | HPL | Float | MIC | GND |
| 9 | 3 poles | Stereo Headphone | HPL | HPR | GND | GND |
| 10 | | Mono Headphone | HPL | Float | GND | GND |
| 11 | | | Float | HPR | GND | GND |
| 12 | | | HPL | HPL | GND | GND |
| 13 | | | HPL | GND | GND | GND |

The audio jack 210 is configured to receive the audio plug 110 and includes connecting portions corresponding to various connecting portions of the audio plug 110. For example, the audio jack 210 includes a tip connecting terminal $T_{TP}$ corresponding to the tip connecting portion 112; a first ring connecting terminal $T_{R1}$ corresponding to the first ring connecting portion 114; a second ring connecting terminal $T_{R2}$ corresponding to the second ring connecting portion 116; and a sleeve connecting terminal $T_{SL}$ corresponding to the sleeve connecting portion 118. The audio jack 210 also includes an insertion detection terminal 212 that is disposed at a position corresponding to one of the connecting portions 112-118.

The insertion detection terminal 212 is electrically floating when the audio jack 210 does not receive any audio plug and is electrically shorted with a corresponding one of the connecting terminals (labeled as $T_{TP}$, $T_{R1}$, $T_{R2}$, or $T_{SL}$, respectively) when the audio jack 210 receives an audio plug. As such, the apparatus 200 is aware of the insertion of the audio plug through the electrical characteristic at the insertion detection portion 212. In some examples, the insertion detection terminal 212 is not electrically coupled with the inserted audio plug directly. Rather, the insertion detection terminal 212 includes an electrode movable by a mechanical member, which is movable by the inserted audio plug. In some embodiments, the mechanical member of the insertion detection terminal 212 is at a first position when the audio jack 210 does not receive any audio plug and at a second position when the audio jack 210 receives an audio plug. In some examples, the electrode of the insertion detection terminal 212 is shorted to a ground reference node when the mechanical member is at one of the first position and the second position, and is electrically floating when the mechanical member is at the other one of the first position and the second position.

The apparatus 200 will be further illustrated with reference to FIG. 2.

Figure 2:
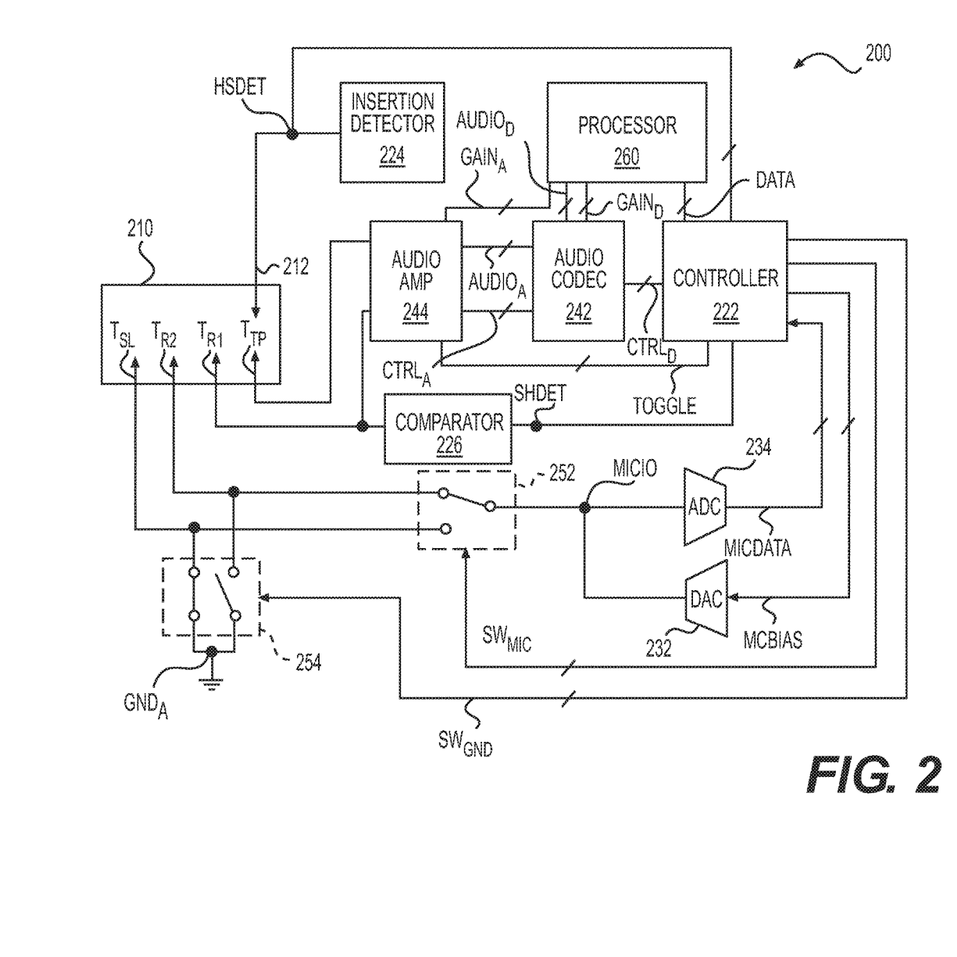
FIG. 2 shows an example functional block diagram of an apparatus, such as the apparatus in FIG. 1, for generating output signals according to an embodiment of the disclosure.

FIG. 2 shows an example functional block diagram of the apparatus 200 for generating output signals according to an embodiment of the disclosure.

The apparatus 200 includes the audio jack 210. The apparatus 200 also includes a controller 222, an insertion detector 224, a comparator 226, a current mode digital-to-analog converter (DAC) 232, an analog-to-digital converter (ADC) 234, an audio codec 242, an audio amplifier 244, switches 252 and 254, and a processor 260. The controller 222, insertion detector 224, a comparator 226, current mode digital-to-analog converter (DAC) 232, analog-to-digital converter (ADC) 234, audio codec 242, audio amplifier 244, switches 252 and 254, and processor 260 are collectively referred to as a signal processing circuit.

The processor 260 includes a single processing core or multiple processing cores, in various embodiments. The processor 260 is configured to execute various applications to perform various functions, including to output audio signals in digital form to the audio codec 242 through bus $AUDIO_D$, and to control amplification gain(s) of the audio codec 242 and/or the audio amplifier 244 through bus $GAIN_D$ and bus $GAIN_A$. The processor 260 and the controller 222 also exchange information through bus DATA. In some embodiments, the amplification gain(s) of one of the audio codec 242 and the audio amplifier 244 is not adjustable, and the corresponding bus $GAIN_D$ or $GAIN_A$ is thus omitted.

The controller 222 is a logic circuit that manages the operation of the apparatus 200 during a detection mode and configures the apparatus 200 for a normal operation mode. During the detection mode, the controller 222 obtains the information with respect to the insertion of an audio plug, a type of the inserted audio plug (e.g., which case among the thirteen example cases in Table I), and load resistance values of the inserted audio plug measured at the tip connecting terminal $T_{TP}$ and the first ring connecting terminal $T_{R1}$. During the normal operation mode, the controller 222 sets up the connections between various components and the connecting terminals $T_{TP}$, $T_{R1}$, $T_{R2}$, and $T_{SL}$ through the switches 252 and 254 based on the detection result and configures the audio codec 242 and the audio amplifier 244 accordingly, and the processor 260 outputs the audio signals in digital form to the audio codec 242 and sets the amplification gain for generating the outputs signals based on the audio signals. During the normal operation mode, the controller 222 also receives the microphone data through bus MICDATA and passes the microphone data to the processor 260.

During the detection mode, the controller 222 receives signals from the insertion detector 224 (at node labeled as "HSDET"), the comparator 226 (at node labeled as "SHDET"), and the audio amplifier 244 (through bus labeled as "TOGGLE"). The controller 222 is also configured to output control signals to set the switch 252 (through bus labeled as "$SW_{MIC}$") and the switch 254 (through bus labeled as "$SW_{GND}$") and to output digital values for driving the current mode DAC 232 (through bus labeled as "MICBIAS") and the audio codec (through bus labeled as "$CTRL_D$"). The controller 222 also receives a digital value from the DAC 234 (through bus labeled as "MICDATA").

In some examples, the processor 260 and the controller 222 are implemented as an integrated logic circuit, and the processor 260 and the controller 222 is thus replaced with a consolidated controller.

The insertion detector 224 is electrically coupled with the insertion detection terminal 212 at node HSDET and is configured to determine whether the audio jack 210 receives an audio plug based on whether the insertion detection terminal 212 is electrically floating or electrically shorted with another connecting terminal or a ground reference node (e.g., ground reference node $GND_A$). In some examples, the insertion detector 224 includes a pull-up resistor that is configured to allow the voltage level at the node HSDET to drop to a logic low level when the insertion detection terminal 212 is electrically coupled with another connecting terminal or the ground reference node; and to pull the voltage level at the node HSDET to a logic high level when the insertion detection terminal 212 is electrically floating.

The comparator 226 is configured to detect whether a voltage level at the first ring connecting terminal $T_{R1}$ is greater than a predetermined threshold voltage and output the comparison result to node SHDET in an embodiment. In some examples, during the detection mode when the audio amplifier 244 is driving the tip connecting terminal $T_{TP}$ and set an output channel corresponding to the first ring connecting terminal $T_{R1}$ to a high-resistance output mode, the comparator 226 outputs a comparison result indicating weather the first ring connecting terminal $T_{R1}$ is also being driven by the audio amplifier 244, which indicates whether the tip connecting terminal $T_{TP}$ and the first ring connecting terminal $T_{R1}$ are electrically shorted through the audio plug 110 and/or the components 120 of the peripheral 100. When a channel is at the high-resistance output mode, the channel does not output driving signals and functions as an open circuit. In contrast, when a channel is at a driving mode, the channel outputs driving signals.

The current mode DAC 232 is configured to output a bias current to a node (labeled as "MICIO"), where an amount of the current is controlled by a digital current value provided by the controller 222 through a bus (labeled as "MICBIAS"). The ADC 234 is configured to convert a voltage level at the node MICIO to a digital voltage value and output the digital voltage value to the controller 222 through bus MICDATA. In some examples during the normal operation mode, the current mode DAC 232 output the bias current to drive the microphone of a peripheral connected to the audio jack 210, such as the microphone 126 in FIG. 1. In some examples during the normal operation mode, the ADC 234 output the digital voltage value representing an audio signal picked up by the microphone of a peripheral connected to the audio jack 210, such as the microphone 126. In some examples during the detection mode, the current mode DAC 232 outputs the a test current to drive a load of a peripheral connected to the audio jack 210, and the ADC 234 detects the voltage level at the node MICIO. Based on the detected voltage level in view of the known current level of the test current, a current-voltage relationship of the load is determined.

The audio codec 242 and the audio amplifier 244 together generate output signals for driving corresponding load resistance of the inserted audio plug. In the present disclosure, the audio codec 242 and the audio amplifier 244 are also collectively referred to as a signal generation circuit.

In an embodiment, the audio codec 242 is configured to receive, in digital form, one or more audio signals that correspond to one or more corresponding channels from the controller 222. The audio signals are received through bus $CTRL_D$ or the processor 260 through bus $AUDIO_D$, and one or more audio signals are output in an analog form, corresponding to the one or more corresponding channels, to the audio amplifier 244 through bus $AUDIO_A$. In some examples, the audio codec 242 includes a digital-to-analog converter (DAC) configured to generate the one or more audio signals in analog form based on the one or more audio signals in digital form. The audio codec 242 receives a DAC gain setting parameter from the processor 260 through bus $GAIN_D$. In some examples, the audio codec 242 receives the audio signals through bus $AUDIO_D$ during the normal operation mode; and receives the test signals through bus $CTRL_D$ during the detection mode. The audio codec 242 also transmits various control signals to the audio amplifier 244 through bus $CTRL_A$, such as control signals indicating whether one or more channels is to be set at a driving mode, a mute mode, or a high-resistance output mode.

The audio amplifier 244 is configured to adjust the amplitudes of the one or more audio signals that are in analog form and received from the audio codec 242 through bus $AUDIO_A$. The audio amplifier 244 is also configured to output the amplified audio signals as output signals to respective output terminals of the audio amplifier 244. During the normal operation mode, the output terminals of audio amplifier 244 are electrically coupled with the tip connection terminal $T_{TP}$ and the first ring connection terminal $T_{R1}$ of the audio jack 210, respectively. During the detection mode, a current comparator, such as a current comparator in the audio amplifier 244, is inserted between the tip connection terminal $T_{TP}$ or the first ring connection terminal $T_{R1}$ and the corresponding output terminal of audio amplifier 244. The audio amplifier 244 receives an amplifier gain setting parameter from the processor 260 through bus $GAIN_A$. In some examples, the audio amplifier 244 also includes one or more current comparators configured to output one or more comparison results to bus TOGGLE. In an embodiment, the comparison results indicate the current through the tip connection terminal $T_{TP}$ and the first ring connection terminal $T_{R1}$ reaches a predetermined threshold current during the detection mode. In some examples, such indications are used to measure the current levels at various connecting terminals. Further details with respect to the current comparators in the audio amplifier 244 will be described with reference to FIG. 6.

The switch 252 is configured to selectively couple the node MICIO to the second ring connecting terminal $T_{R2}$ or the sleeve connecting terminal $T_{SL}$ in response to the control signal from the controller 222 through bus $SW_{MIC}$. The switch 254 is configured to selectively couple the second ring connecting terminal $T_{R2}$ to a ground reference node $GND_A$ or to selectively couple the sleeve connecting terminal $T_{SL}$ to the ground reference node $GND_A$ in response to corresponding control signals from the controller 222 through bus $SW_{GND}$.

When an audio plug is inserted into the audio jack 210, the insertion detector 224 reflects the insertion of the audio plug at the voltage level at node HSDET, and the controller 222 is thus aware of the insertion of the audio plug and begins to operate in the detection mode.

During the detection mode, the controller 222 first detects whether the second ring connecting terminal $T_{R2}$ or the sleeve connecting terminal $T_{SL}$ is electrically coupled with the ground reference node, such as ground reference node GND in FIG. 1. In some examples, whether a connecting terminal is coupled with the ground reference node id determined by measuring the voltage value at the node when a predetermined amount of current is provided. For example, giving a predetermined amount of current, if the voltage level at the second ring connecting terminal $T_{R2}$ or the sleeve connecting terminal $T_{SL}$ is less than a first threshold, the corresponding connecting terminal is determined to be coupled with the ground reference node; if the voltage level at the second ring connecting terminal $T_{R2}$ or the sleeve connecting terminal $T_{SL}$ is greater than a second threshold, the connecting terminal is determined to be coupled with the microphone, such as the microphone bias/signal node MIC in FIG. 1. In some examples, the second threshold is greater than the first threshold. In some examples, if the voltage level at the second ring connecting terminal $T_{R2}$ or the sleeve connecting terminal $T_{SL}$ is between the first and second thresholds, the controller 222 identifies the inserted plug as corresponding to an apparatus outside the scope of the examples listed in TABLE I.

In some examples, to measure the voltage at the second ring connecting terminal $T_{R2}$ as discussed above, the controller 222 sets the switch 252 to electrically couple the node MICIO with the second ring connecting terminal $T_{R2}$ and sets the switch 254 to electrically couple the sleeve connecting terminal $T_{SL}$ to the ground reference node $GND_A$ and electrically decouple the second ring connecting terminal $T_{R2}$ from the ground reference node $GND_A$. The controller 222 then controls the current mode DAC 232 to inject a current to the audio plug through the second ring connecting terminal $T_{R2}$ and determines a voltage level at the second ring connecting terminal $T_R Z$ using the ADC 234. In some examples, to measure the voltage at the sleeve connecting terminal $T_{SL}$ as discussed above, the controller 222 sets the switch 252 to electrically couple the node MICIO with the sleeve connecting terminal $T_{SL}$ and sets the switch 254 to electrically couple the second ring connecting terminal $T_{R2}$ to the ground reference node $GND_A$ and electrically decouple the sleeve connecting terminal $T_{SL}$ from the ground reference node $GND_A$. The controller 222 then controls the current mode DAC 232 to inject a current to the audio plug through the sleeve connecting terminal $T_{R2}$ and determines a voltage level at the sleeve connecting terminal $T_{R2}$ using the ADC 234.

Based on the detection results, the controller 222 then determines whether the connecting terminals of the inserted audio plug corresponding to the second ring connecting terminal $T_{R2}$ and the sleeve connecting terminal $T_{R2}$ are coupled to the ground reference node and sets the switches 252 and 254 to provide suitable connections consistent with the detection results (e.g., consistent with one of the thirteen cases in Table I).

For example, if the connecting terminal of the audio plug that is coupled with the second ring connecting terminal $T_{R2}$ is determined to correspond to a microphone bias/signal node MIC of the peripheral, the controller 222 sets the switch 254 to electrically decouple the second ring connecting terminal $T_{R2}$ from the ground reference node $GND_A$ of the apparatus 200 and sets the switch 252 to electrically couple the second ring connecting terminal $T_{R2}$ to the node MICIO. Also, if the connecting terminal of the audio plug that is coupled with the sleeve connecting terminal $T_{SL}$ is determined to correspond to a ground reference node of the peripheral, the controller 222 sets the switch 254 to electrically couple the sleeve connecting terminal $T_{SL}$ to the ground reference node $GND_A$ of the apparatus 200. Under this circumstance, the controller 222 determines that the audio plug has a 4-pole, Type I configuration (corresponding to Cases 2 and 6-8 in Table I).

In some other examples, if the connecting terminal of the audio plug that is coupled with the sleeve connecting terminal $T_{SL}$ is determined to correspond to a microphone bias/signal node MIC of the peripheral, the controller 222 sets the switch 254 to electrically decouple the sleeve connecting terminal $T_{SL}$ from the ground reference node $GND_A$ of the apparatus 200 and sets the switch 252 to electrically couple the sleeve connecting terminal $T_{SL}$ to the node MICIO. Also, if the connecting terminal of the audio plug that is coupled with the second ring connecting terminal $T_{R2}$ is determined to correspond to a ground reference node of the peripheral, the controller 222 sets the switch 254 to electrically couple the second ring connecting terminal $T_{R2}$ to the ground reference node $GND_A$ of the apparatus 200. Under this circumstance, the controller 222 also determines that the audio plug has a 4-pole, Type II configuration (corresponding to Cases 1 and 3-5 in Table I).

In yet some other examples, if the connecting terminals of the audio plug that are coupled with the second ring connecting terminal $T_{R2}$ and the sleeve connecting terminal $T_{SL}$ are determined to correspond to the ground reference node of the peripheral, the controller 222 sets the switch 252 to electrically decouple the second ring connecting terminal $T_{R2}$ and the sleeve connecting terminal $T_{SL}$ from the node MICIO and sets the switch 254 to electrically couple both the second ring connecting terminal $T_{R2}$ and the sleeve connecting terminal $T_{SL}$ to the ground reference node $GND_A$. Under this circumstance, the controller 222 also determines that the audio plug has a 3-pole configuration.

During the detection mode, after detecting and configuring the second ring connecting terminal $T_{R2}$ and the sleeve connecting terminal $T_{SL}$, the controller 222 detects the load resistances values of the inserted audio plug measured at the tip connecting terminal T-r and the first ring connecting terminal $T_{R1}$ and determines whether the tip connecting terminal $T_{TP}$ and the first ring connecting terminal $T_{R1}$ are electrically shorted through the inserted audio plug.

To determine the load resistance value of the inserted audio plug measured at the tip connecting terminal $T_{TP}$, the controller 222 sets an output channel of the audio amplifier 244 that corresponds to driving the first ring connecting terminal $T_{R1}$ at the high-resistance output mode. Also, the controller 222 sets the audio amplifier 244 to electrically route a current comparator between the output terminal of the audio amplifier 244 and the tip connecting terminal $T_{TP}$. The controller 222 uses the audio amplifier 244 as a voltage supply to gradually increase a voltage level at the tip connecting terminal $T_{TP}$ and uses the current comparator to determine if a current drawn from the audio amplifier 244 has reached a predetermined current level. A voltage level (e.g., Vx) by the time the drawn current reaches the predetermined current level (e.g., Ix) is used to calculate a resistance value (e.g., Rx=Vx/Ix) at the tip connecting terminal $T_{TP}$ as the load resistance value of the inserted audio plug measured at the tip connecting terminal $T_{TP}$.

While driving the tip connecting terminal $T_{TP}$ to determine the corresponding load resistance value at the connecting terminal of the inserted audio plug corresponding to the tip connecting terminal $T_{TP}$ as discussed above, the comparator 226 also detects if the first ring connecting terminal $T_{R1}$ is also being driven by the audio amplifier 244. If the comparator 226 detects that a voltage level at the first ring connecting terminal $T_{R1}$ exceeds a predetermined voltage level, the controller 222 determines that the tip connecting terminal $T_{TP}$ and the first ring connecting terminal $T_{R1}$ are electrically shorted through the inserted audio plug. In some examples, the tip connecting terminal $T_{TP}$ and the first ring connecting terminal $T_{R1}$ are electrically shorted through the inserted audio plug, which correspond to cases 4, 7, and 12 in TABLE I.

If the tip connecting terminal $T_{TP}$ and the first ring connecting terminal $T_{R1}$ not electrically shorted through the inserted audio plug, the controller proceeds to determine the load resistance value of the inserted audio plug measured at the first ring connecting terminal $T_{R1}$.

To determine the load resistance value of the inserted audio plug measured at the first ring connecting terminal $T_{R1}$, the controller 222 sets an output channel of the audio amplifier 244 that corresponds to driving the tip connecting terminal $T_{TP}$ at the high-resistance output mode. Also, the controller 222 sets the audio amplifier 244 to electrically route the current comparator between the output terminal of the audio amplifier 244 corresponding to the first ring connecting terminal $T_{R1}$ and the first ring connecting terminal $T_{R1}$. In accordance with an embodiment, the controller 222 uses the audio amplifier 244 as a voltage supply to gradually increase a voltage level at the first ring connecting terminal $T_{R1}$ and uses the current comparator to determine if a current drawn from the audio amplifier 244 has reached a predetermined current level. A voltage level by the time the drawn current reaches the predetermined current level is used to calculate a current-voltage relationship at the first ring connecting terminal $T_{R1}$, and the load resistance value of the inserted audio plug measured at the first ring connecting terminal $T_{R1}$ is thus determined.

After the load resistance values of the audio plug measurable at the tip connecting terminal $T_{TP}$ and the first ring connecting terminal $T_{R1}$ have been determined, the controller 222 configures the audio amplifier 244 to set the output channels corresponding to the first ring connecting terminal $T_{R1}$ and the tip connecting terminal $T_{TP}$ at a driving mode or at a high-resistance output mode.

In some examples, if a measured load resistance value is lower than a third threshold, the corresponding connecting terminal of the first connector is determined to be coupled with the ground reference node of the second connector. An output channel for driving the connecting terminal is thus set to the high-resistance output mode. In some examples, if a measured load resistance value is greater than a fourth threshold, the load resistance is considered to be too high to be effectively driven by the output channel, and the corresponding connecting terminal of the first connector is determined to be electrically floating. An output channel for driving the connecting terminal is thus set to either the driving mode or the high-resistance output mode. In some examples, if a measured load resistance value ranges from the third threshold to the fourth threshold, the load resistance is considered to be within the to the designed driving capability of an output cannel, and the output channel for driving the connecting terminal is set to the driving mode. In some embodiments, the third threshold is 4 ohms, and the fourth threshold is 1000 ohms.

Also, the controller 222 reports the determined load resistance values to the processor 260. The processor 260 then sets amplification gains for generating the output signals to drive the tip connecting terminal $T_{TP}$ and/or the first ring connecting terminal $T_{R1}$. The audio codec 242 and the audio amplifier 244 generate the output signals at the set amplification gains. In some examples, an amplification gain for each output signal includes a first parameter applicable to the DAC portion of the audio codec 242 and/or a second parameter applicable to the analog amplifier of the audio amplifier 244.

In some examples, an amplification gain is set to be proportional to the corresponding load resistance value. As such, if a user replaces a headphone with higher speaker impedance by a headphone with lower speaker impedance used for listening to music output by the apparatus 200, the voltage amplitude of the driving signal is adjusted accordingly to reduce the likelihood of causing uncomfortable experiences or even hearing losses to the user. In some examples, an amplification gain is set based on a look-up table using the measured load resistance value as an index.

Figure 3:
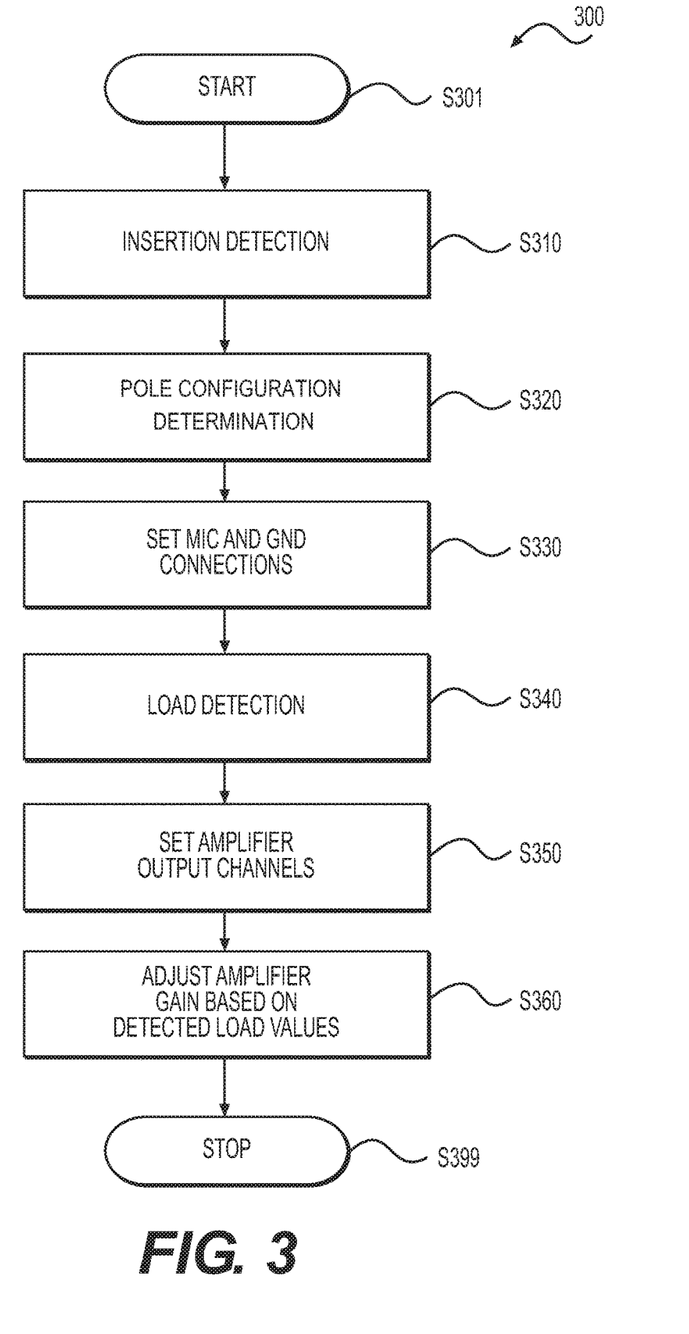
FIG. 3 shows an example flow chart outlining a process of generating output signals to be output to a connector according to an embodiment of the disclosure.

FIG. 3 shows an example flow chart outlining a process 300 of generating output signals to be output to a connector according to an embodiment of the disclosure. It is noted that in various embodiments additional operations are performed before, during, and/or after the process 300 depicted in FIG. 3.

In some embodiments, the process 300 is performed by the controller 222 and the processor 260 controlling other components of apparatus 200 in FIG. 2, and the detailed description of some operations thus may be simplified or omitted. The process 300 starts at S301 and proceeds to S310.

At S310, an insertion detection process is performed to detect establishment of connection between a first connector and a second connector. The first connector is configured to receive the second connector so that the connecting terminals at respective portions of the first and second connectors are coupled together. The process 300 proceeds to S320 after the detection of establishment of connection between the first and second connectors.

For example, the first connector corresponds to the audio jack 210, and the second connector corresponds to the audio plug 110. The insertion detector 224 sets the voltage level at a node HSDET at different logic levels indicating the presence or absence of the connection between the audio plug and the audio jack.

At S320, a pole configuration determination process based on whether a first set of connecting terminals of the first connector is coupled to a ground reference node of the second connector. In some examples, the pole configuration determination process includes identifying a connecting terminal of the first connector that is electrically coupled with a ground terminal of the second connector (or simplified as "electrically grounded"), and then determining a type of the second connector based on the connecting portion of the identified connecting portion of the first connector that is electrically grounded.

For example, the controller 222 injects, using the current mode DAC 232, a test current to the second ring connecting terminal $T_{R2}$ and the sleeve connecting terminal $T_{SL}$ one after the other and measures the corresponding voltage levels using the ADC 234 or other suitable circuit. Based on such information, the controller 222 determines whether the inserted audio plug has a 3-pole configuration or a 4-pole configuration. Additional details of the pole configuration determination process for an audio jack will be further illustrated with reference to FIG. 4.

At S330, after determining whether the first set of connecting terminals of the first connector is coupled to the ground reference node of the second connector, one or more connecting terminals determined to be coupled to the ground reference node of the second connector are electrically coupled to the ground reference node of the apparatus where the first connector resides. Other connecting terminal(s) of the first set of connecting terminals of the first connector is coupled with suitable node(s).

For example, after determining whether the second ring connecting terminal $T_{R2}$ or the sleeve connecting terminal $T_{SL}$ is electrically coupled to the ground reference node of the audio plug, the controller 222 sets the switch 254 to electrically couple the corresponding connecting terminals to the ground reference node $GND_A$ and sets the switch 252 to electrically couple the non-grounded connecting terminal to the DAC 232 and the ADC 234 through node MICIO.

At S340, the load resistance values of the second connector measured at a second set of connecting terminals of the first connector are determined. In some examples, a first load resistance value of the second connector is determined based on a current-voltage relationship at a first terminal of the second connector that is configured to receive a first output signal when coupled to the first connector. Also, a second load resistance value of the second connector is determined based on a current-voltage relationship at a second terminal of the second connector that is configured to receive a second output signal when coupled to the first connector.

For example, the controller 222 provides, using the audio amplifier 244 as a voltage source in an embodiment, a test voltage to the corresponding loads of the audio plug. Also, the controller 222 configures the audio amplifier to reroute a current comparator between a connecting terminal under test and the output terminal of the corresponding output channel of the audio amplifier 244. The current comparator determines whether the current drawn by the corresponding load has reached a predetermined current level. The controller 222 then calculates the load resistance values based on the predetermined current level and the voltage levels when the current reaches the predetermined current level. Additional details of the load detection process for an audio jack will be further illustrated with reference to FIGS. 5 and 6.

At S350, after determining the load resistance values of the second connector measured at the second set of connecting terminals of the first connector, the output channels of the signal generation circuit that is configured to drive the loads of the second connector is set accordingly. For example, if the load resistance value measured at a connecting terminal is less than a lower threshold, the connecting terminal is determined to be grounded, and the corresponding channel for driving the load through the connecting terminal is set to a high-resistance output mode. If the load resistance value measured at a connecting terminal is greater than a higher threshold, the connecting terminal is determined to be electrically floating, and the corresponding channel for driving the load through the connecting terminal is set to the high-resistance output mode or a driving mode. If the load resistance value measured at a connecting terminal is between the lower threshold and the higher threshold, the corresponding channel for driving the load through the connecting terminal is set to the driving mode.

For example, after determining the load resistance values measured at the tip connecting terminal $T_{TP}$ and the first ring connecting terminal $T_{R1}$, the controller 222 configures the output channels of the audio amplifier 244 to either the driving mode or the high-resistance mode accordingly.

At S360, the amplification gain for an output signal is set based on the corresponding load resistance value. In some examples, the amplification gain is proportional to the corresponding load resistance value.

For example, the processor 260 sets the amplification gain for each output signal by either adjusting the gain settings applicable to the audio codec 242 or the gain settings applicable to the audio amplifier 244, or both.

After S360, the process 300 the process proceeds to S399 and terminates.

Figure 4:
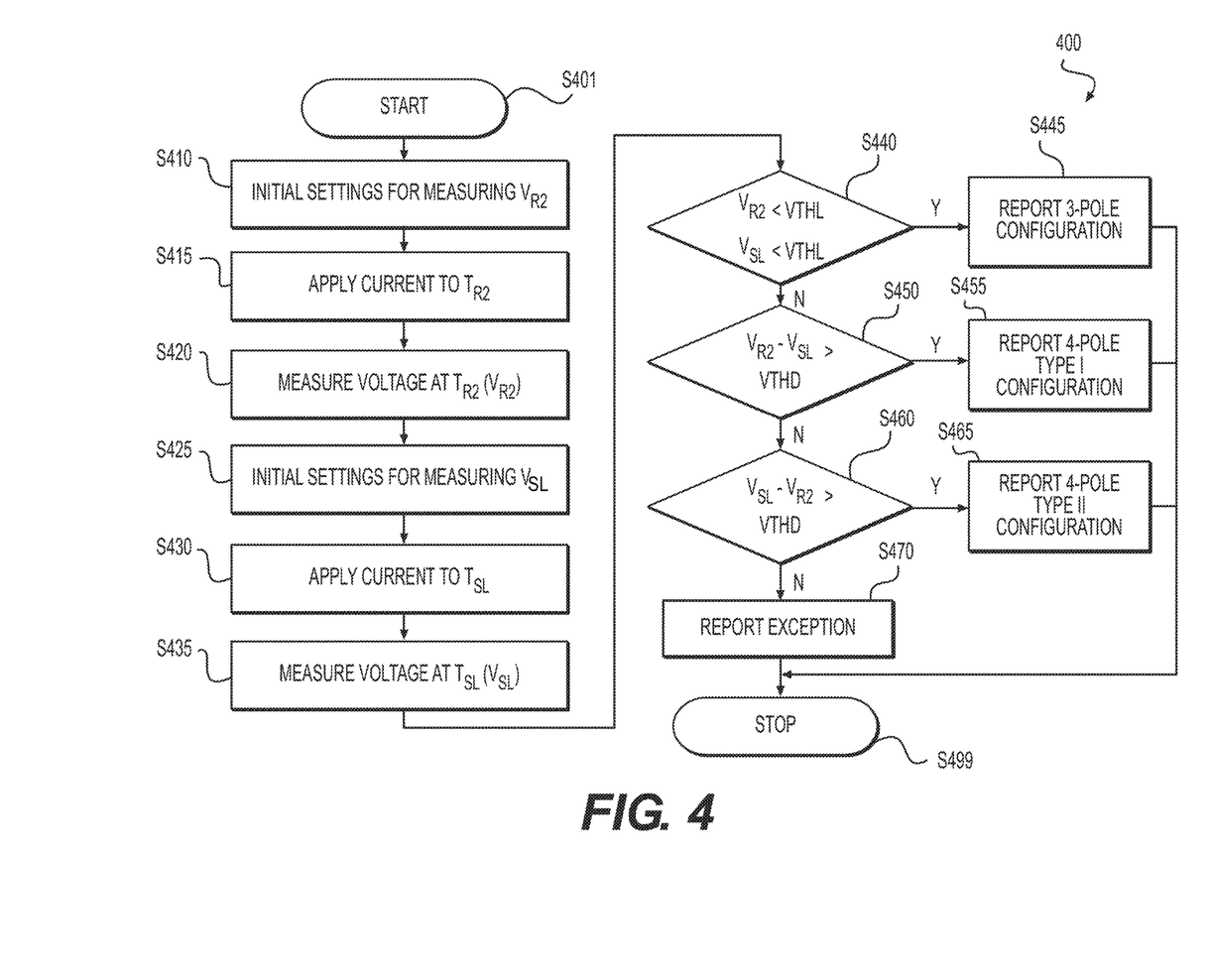
FIG. 4 shows an example flow chart outlining a pole configuration determination process, such as the pole configuration determination process in FIG. 4, according to an embodiment of the disclosure.

FIG. 4 shows an example flow chart outlining a pole configuration determination process 400 according to an embodiment of the disclosure. It is noted that in various embodiments additional operations are performed before, during, and/or after the process 400 depicted in FIG. 4. In FIG. 4, the pole configuration determination process 400 corresponds to operation S320 in FIG. 3 and is applicable to an audio jack receiving an audio plug is illustrated as a non-limiting example. Other types of connectors and corresponding modifications are within contemplated embodiments.

In some embodiments, the process 400 is performed by the controller 222 controlling other components of apparatus 200 in FIG. 2, and the detailed description of some operations thus may be simplified or omitted. The process 400 starts at S401 and proceeds to S410.

At S410, a set of initial settings is applied to a signal processing circuit in order to measure a voltage value of an inserted audio plug that is measured at the second ring connecting terminal, such as the connecting terminal $T_{R2}$ in FIG. 2.

For example, the controller 222 sets the switch 254 to electrically couple the sleeve connecting terminal $T_{SL}$ to the ground reference node $GND_A$ and set the switch 252 to electrically coupled the second ring connecting terminal $T_{R2}$ to the node MICIO.

At S415, a test current is applied to the second ring connecting terminal. In some examples, the test current is applied by gradually increasing the current level from zero to a predetermined current level over a predetermined period of time.

For example, the controller 222 controls the current mode DAC 232 to apply a test current to the second ring connecting terminal $T_{R2}$. In some examples, the test current is applied by gradually increasing the current level from zero to 250 μA over a period of 40 to 60 ms.

At S420, the voltage level at the second ring connecting terminal (denoted as $V_{R2}$ in FIG. 4) is measured when the test current reaches the predetermined current level. The resistance value of the inserted audio plug corresponding to the second ring connecting terminal is proportional to the measured voltage level when the test current reaches the predetermined current level. In some examples, after measuring the voltage level $V_{R2}$, the current applied to the second ring connecting terminal is reduced to zero.

At S425, a set of initial settings is applied to the signal processing circuit in order to measure a resistance value of the inserted audio plug that is measured at the sleeve connecting terminal, such as the connecting terminal $T_{SL}$ in FIG. 2.

For example, the controller 222 sets the switch 254 to electrically couple the second ring connecting terminal $T_{R2}$ to the ground reference node $GND_A$ and set the switch 252 to electrically coupled the sleeve connecting terminal $T_{SL}$ to the node MICIO.

At S430, a test current is applied to the sleeve connecting terminal $T_{SL}$. In some examples, the test current is applied by gradually increasing the current level from zero to the predetermined current level over the predetermined period of time.

For example, the controller 222 controls the current mode DAC 232 to apply current to the sleeve connecting terminal $T_{SL}$. In some examples, the current is applied by gradually increasing the current level from zero to 250 μA over a period of 40 to 60 ms.

At S435, the voltage level at the sleeve connecting terminal (denoted as $V_{SL}$ in FIG. 4) is measured when the test current reaches the predetermined current level. The resistance value of the inserted audio plug corresponding to the sleeve connecting terminal is proportional to the measured voltage level when the test current reaches the predetermined current level. In some examples, after measuring the voltage level $V_{SL}$, the current applied to the second ring connecting terminal is reduced to zero.

At S440, the measured voltage levels $V_{R2}$ and $V_{SL}$ are compared with a first threshold (denoted as VTHL in FIG. 4). When both voltage levels $V_{R2}$ and $V_{SL}$ are less than the first threshold VTHL, the process proceeds to S445, where the connecting terminals of the inserted audio plug corresponding to the second ring connecting terminal and the sleeve connecting terminal are determined as coupled to the ground reference node. Thus, the inserted audio plug is determined to have a 3-pole configuration (corresponding to cases 9-13 in Table I). In some examples, the first threshold VTHL is programmable. In some examples, the first threshold VTHL is set to be 50 mV.

When at least one voltage level $V_{R2}$ or $V_{SL}$ is equal to or greater than the first threshold VTHL, the process proceeds to S450.

At S450, a result of voltage level $V_{R2}$ minus voltage level $V_{SL}$ is compared with a second threshold (denoted as VTHD in FIG. 4). When the result is greater than the second threshold VTHD, the process proceeds to S455, where the connecting terminals of the inserted audio plug corresponding to the second ring connecting terminal is determined to be a microphone bias/signal node, and the connecting terminals of the inserted audio plug corresponding to the sleeve connecting portion is determined as coupled to the ground reference node. Thus, the inserted audio plug is determined to have a 4-pole, Type I configuration (corresponding to Cases 2 and 6-8 in Table I). In some examples, the second threshold VTHD is programmable. In some examples, the second threshold VTHD is set to be 100 mV.

When the result is equal to or less than the second threshold VTHD, the process proceeds to S460.

At S460, a result of voltage level $V_{SL}$ minus voltage level $V_{R2}$ is compared with the second threshold VTHD. When the difference result is greater than the second threshold VTHD, the process proceeds to S465, where the connecting terminals of the inserted audio plug corresponding to the sleeve connecting terminal is determined to be a microphone bias/signal node, and the connecting terminals of the inserted audio plug corresponding to the second ring connecting terminal is determined as coupled to the ground reference node. Thus, the inserted audio plug is determined to have a 4-pole, Type II, configuration (corresponding to Cases 1 and 3-5 in Table 1).

When the result is equal to or less than the second threshold VTHD, the process proceeds to S470.

At S470, an exception result is reported to indicate that the inserted audio plug does no fall into any of the 13 predetermined configurations as listed in Table I.

After S445, S455, S465, or S470, the process 400 the process proceeds to S499 and terminates.

Figure 5:
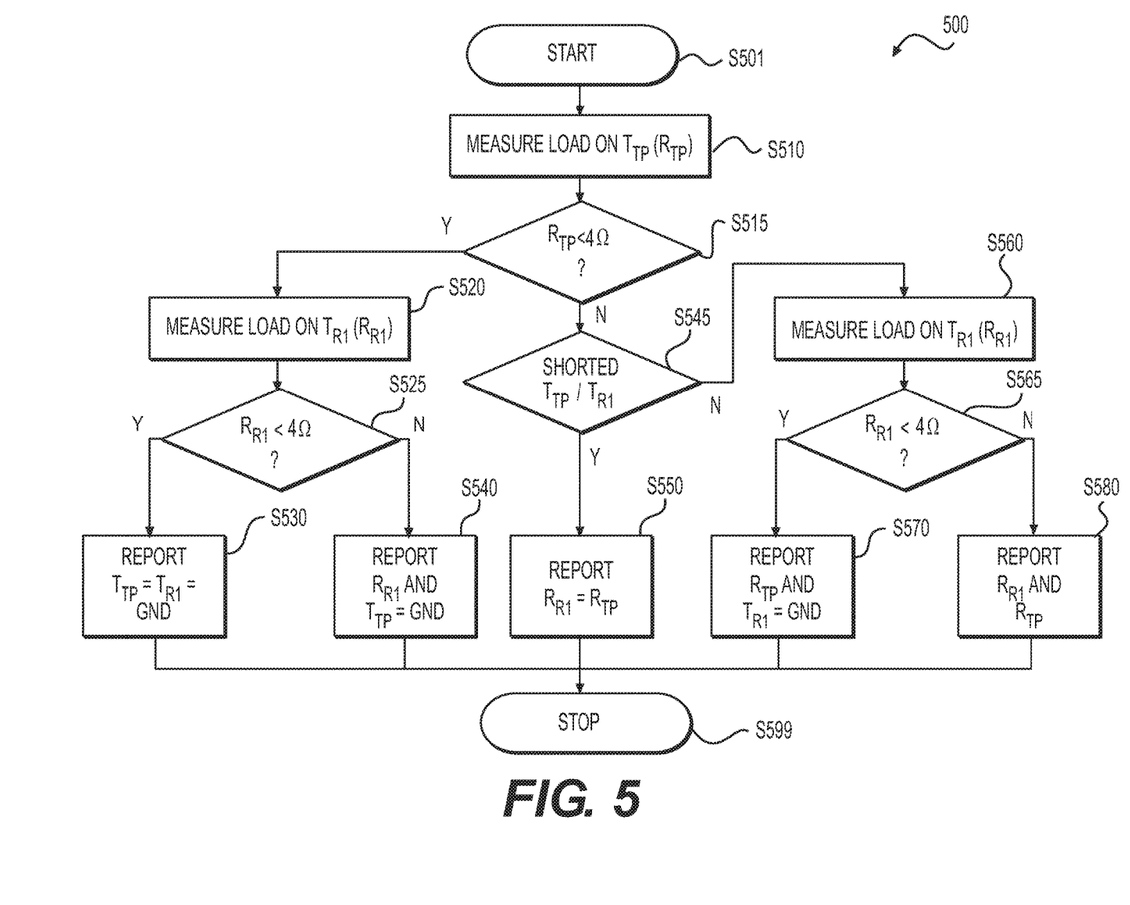
FIG. 5 shows an example flow chart outlining a load detection process, such as the load detection process in FIG. 4, according to an embodiment of the disclosure.

FIG. 5 shows an example flow chart outlining a load detection process 500 according to an embodiment of the disclosure. It is noted that in various embodiments additional operations are performed before, during, and/or after the process 500 depicted in FIG. 5. In FIG. 5, the load detection process corresponds to S340 in FIG. 3 and is applicable to an audio jack receiving an audio plug is illustrated as a non-limiting example. Other types of connectors and corresponding modifications are within contemplated embodiments.

In some embodiments, the process 500 is performed by the controller 222 controlling other components of apparatus 200 in FIG. 2, and the detailed description of some operations thus may be simplified or omitted. The process 500 starts at S501 and proceeds to S510.

At S510, the load resistance value of an inserted audio plug (denoted $R_{TP}$ in FIG. 5) is measured at the tip connecting terminal $T_{TP}$ of the audio jack. In some embodiments, the controller 222 uses an output channel of the audio amplifier 244 for driving the tip connecting terminal $T_{TP}$ to provide a test voltage to the tip connecting terminal $T_{TP}$ until a current drawn by the tip connecting terminal $T_{TP}$ reaches a predetermined current level. In some embodiments, an output channel of the audio amplifier 244 for driving the first ring connecting terminal $T_{R1}$ is set to a high-resistance output mode while measuring the resistance value at the tip connecting terminal $T_{TP}$.

At S515, it is determined whether the load resistance value $R_{TP}$ is less than a threshold value, such as 4 ohms. If the load resistance value $R_{TP}$ is less than the threshold value, the connecting terminals of the audio plug that corresponds to the tip connecting terminal $T_{TP}$ of the audio jack is determined to be grounded, and the process proceeds to S520. If the load resistance value $R_{TP}$ is equal to or greater than the threshold value, the process proceeds to S545.

At S520, the load resistance value of the inserted audio plug (denoted as $R_{R1}$ in FIG. 5) is measured at the first ring connecting terminal $T_{R1}$ of the audio jack. In some embodiments, the controller 222 uses an output channel of the audio amplifier 244 for driving the first ring connecting terminal $T_{R1}$ to provide a test voltage to the first ring connecting terminal $T_{R1}$ until a current drawn by the first ring connecting terminal $T_{R1}$ reaches a predetermined current level. In some embodiments, an output channel of the audio amplifier 244 for driving the tip connecting terminal $T_{TP}$ is set to a high-resistance mode while measuring the resistance value at the first ring connecting terminal $T_{R1}$.

At S525, it is determined whether the load resistance value $R_{R1}$ is less than a threshold value, such as 4 ohms. If the load resistance value $R_{R1}$ is less than the threshold value, the connecting terminals of the audio plug that corresponds to the first ring connecting terminal of the audio jack is determined to be grounded, and the process proceeds to S530. If the load resistance value $R_{TP}$ is equal to or greater than the threshold value, the process proceeds to S540.

At S530, a detection result indicating that the connecting terminals of the inserted audio plug corresponding to the tip connecting terminal $T_{TP}$ and the first ring connecting terminal $T_{R1}$ of the audio jack are grounded is reported.

At S540, a detection result indicating the connecting terminals of the inserted audio plug corresponding to the tip connecting terminal $T_{TP}$ as grounded and the load resistance value $R_{R1}$ of the inserted audio plug measured at the first ring connecting terminal $T_{R1}$ is reported. The inserted audio plug in this case corresponds to Case 3, 6, or 13 in Table I.

At S545, it is determined whether the tip connecting terminal $T_P$ and the first ring connecting terminal $T_{R1}$ are electrically shorted through the inserted audio plug. For example, it is determined, by a comparator, whether the tip connecting terminal $T_{TP}$ and the first ring connecting terminal $T_{R1}$ are electrically shorted. When the connecting terminal $T_{TP}$ and the first ring connecting terminal $T_{R1}$ are shorted, the first ring connecting terminal $T_{R1}$ is also driven by the output channel for driving the tip connecting terminal $T_{TP}$ when the output channel for driving the first ring connecting terminal $T_{R1}$ is set to the high-resistance output mode. Therefore, when the comparator detects that the first ring connecting terminal $T_{R1}$ is also driven by the output channel for driving the tip connecting terminal $T_{TP}$, the tip connecting terminal $T_{TP}$ and the first ring connecting terminal $T_{R1}$ are determined to be electrically shorted through the inserted audio plug, and the process proceeds to S550. If the tip connecting terminal $T_{TP}$ and the first ring connecting terminal $T_{R1}$ are determined not to be electrically shorted, the process proceeds to S560.

At S550, a detection result indicating that the tip connecting terminal $T_{TP}$ and the first ring connecting terminal $T_{R1}$ are electrically shorted and the load resistance value $R_{TP}$, which is the same as the load resistance value $R_{R1}$, is reported. Because the tip connecting terminal $T_{TP}$ and the first ring connecting terminal $T_{R1}$ are electrically shorted, the inserted audio plug thus corresponds to Case 4, 7, or 12 in Table I.

At S560, the load resistance value of the inserted audio plug $R_{R1}$ is measured at the first ring connecting terminal $T_{R1}$ of the audio jack.

At S565, it is determined whether the load resistance value $R_{R1}$ is less than a threshold value, such as 4 ohms. If the load resistance value $R_{R1}$ is less than the threshold value, the terminal of the audio plug that corresponds to the first ring connecting terminal $T_{R1}$ of the audio jack is determined to be grounded, and the process proceeds to S570. If the load resistance value $R_{TP}$ is equal to or greater than the threshold value, the process proceeds to S580.

At S570, a detection result indicating the connecting terminal of the inserted audio plug corresponding to the first ring connecting terminal $T_{R1}$ as grounded and the load resistance value $R_{TP}$ of the inserted audio plug measured at the tip connecting terminal $T_{TP}$ is reported.

At S580, a detection result indicating the load resistance value $R_{TP}$ of the inserted audio plug measured at the tip connecting terminal $T_{TP}$ and the load resistance value $R_{R1}$ of the inserted audio plug measured at the first ring member $T_{R1}$ is reported. The inserted audio plug thus corresponds to Case 1, 2, 5, 8, 9, 10, or 11 in Table 1.

After S530, S540, S550, S570, or S580, the process 500 the process proceeds to S599 and terminates.

An example measurement circuit for measuring the load resistance values, such as operations S510, S520, or S560, is illustrated with reference to FIG. 6.

Figure 6:
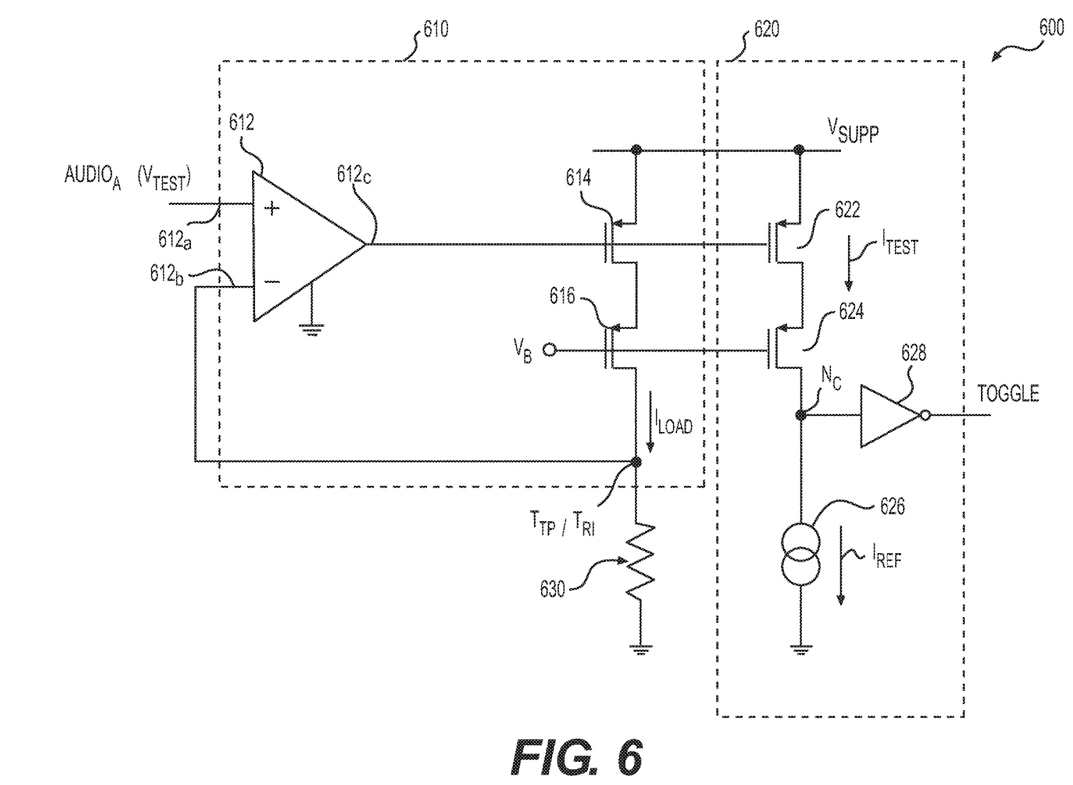
FIG. 6 shows an example schematic diagram of a measurement circuit usable to perform load resistance measurement, such as the load resistance measurement in FIG. 5, according to an embodiment of the disclosure.

FIG. 6 shows an example schematic diagram of a measurement circuit 600 according to an embodiment of the disclosure. The measurement circuit 600 includes an amplifier 610 for an output channel corresponding to a connecting terminal ($T_{TP}$ or $T_{R1}$) that is currently under test, a current comparator 620, and a load resistive device 630 representing the load of the inserted audio plug coupled to the connecting terminal ($T_{TP}$ or $T_{R1}$) that is currently under test. In some embodiments, the amplifier 610 and the current comparator 620 are implemented in the audio amplifier 244. Components in FIG. 6 that are the same or similar to the components in FIG. 2 are given the same reference labels, and detailed description is thus omitted.

The amplifier 610 includes an operational amplifier 612 and an output stage that includes that includes transistors 614 and 616, in an embodiment. The amplifier 612 includes a non-inverting input terminal 612a, an inverting input terminal 612b, and an output terminal 612c. The non-inverting input terminal 612a is configured to receive an analog signal from the bus $AUDIO_A$. The inverting input terminal 612b is electrically coupled with the corresponding connecting portion $T_{TP}$ or $T_{R1}$. The output terminal 612c is electrically coupled with a gate terminal of the transistor 614. Transistors 614 and 616 are coupled in series between a power line $V_{SUPP}$ and corresponding connecting portion $T_{TP}$ or $T_{R1}$. The gate terminal of transistor 616 is configured to receive a bias voltage $V_B$.

In some examples, the audio amplifier 244 in FIG. 2 includes N amplifiers 610, each for one of N output channels, where N is a positive integer. In some examples, the audio amplifier 244 includes only one current comparator 620 shared by the N amplifiers 610. In some examples, the audio amplifier 244 includes more than one current comparator 620 shared by the N amplifiers 610. In at least one example, the audio amplifier 244 includes N current comparators 620, each for a corresponding one of the N amplifiers 610.

During a detection mode, the amplifier 610 receives a test voltage signal $V_{TEST}$ through the bus $AUDIO_A$ at the non-inverting terminal 612a and mirrors the voltage level at the non-inverting terminal 612a to the inverting terminal 612b. In some examples, the test voltage is applied by gradually increasing the voltage level from zero to a predetermined voltage level by a predetermined period of time. For example, the voltage level is increased from 0 V to 250 mV with 0.5 mV per step within a duration of 100 ms.

The current comparator 620 includes transistors 622 and 624 connected in series between the power line $V_{SUPP}$ and a node Nc. The current comparator 620 also includes a reference current source 626 and an inverter 628 coupled with the node Nc. A gate terminal of the transistor 622 is electrically coupled with the gate terminal of the transistor 614. A gate terminal of the transistor 624 is electrically coupled with the gate terminal of the transistor 616. Transistors 622 and 624 are configured to mirror a current $I_{LOAD}$ drawn by the load 630 to a test current $I_{TEST}$ at a predetermined ratio M. The test current test $I_{TEST}$ and the reference current $I_{REF}$ generated by the reference current source 626 compete to pull the voltage level at the input terminal of the inverter 628 (e.g., at the node Nc) to a logic high level or a logic low level. When the voltage level of the test voltage signal $V_{TEST}$ gradually increases, the test current $I_{TEST}$ increases.

The inverter 628 is configured to output the high logic level when the test current $I_{TEST}$ is smaller than the reference current $I_{REF}$, and to output the low logic level when the test current $I_{TEST}$ is equal to or greater than the reference current $I_{REF}$. The output of the inverter 628 is transmitted to the controller 222 through bus TOGGLE. Once the output of the inverter 628 is switched from the logic high level to the logic low level, the controller 222 calculates the resistance value of the load 630 as $V_{TOGGLE}/M \cdot I_{REF}$, where $V_{TOGGLE}$ represents the voltage level of the test voltage signal $V_{TEST}$ at the time that the logic state of the output of the inverter changes.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. An apparatus, comprising:
   a first connector configured to receive a second connector to couple a tip connecting terminal, a first ring connecting terminal, a second ring connecting terminal and a sleeve connecting terminal of the first connector with respective portions of the second connector; and
   a signal processing circuit configured to, after an insertion determination that the first connector is coupled to the second connector:
   measure a first current-voltage (I-V) characteristic of the second connector via the sleeve connecting terminal of the first connector, and a second I-V characteristic of the second connector via the second ring connecting terminal of the first connector;
   determine a set of plural potential pole configurations for the second connector based on the first I-V characteristic and the second I-V characteristic;

detect a first load resistance value at a first connecting terminal of the second connector via the tip connecting terminal of the first connector and a second load resistance value at a second connecting terminal of the second connector via the first ring connecting terminal of the first connector;

select a pole configuration from the set of plural potential pole configurations based on the first load resistance value and the second load resistance value; and set a first amplification gain for generating a first output signal based on the first load resistance value.

2. The apparatus of claim 1, wherein the signal processing circuit comprises:

a signal generation circuit configured to generate the first output signal at the first amplification gain and output the first output signal to the first connecting terminal of the second connector through the first connector; and a controller configured to determine the first load resistance value, and set the first amplification gain based on the first load resistance value.

3. The apparatus of claim 2, wherein the first connector comprises the tip connecting terminal to which the first output signal is output, the tip connecting terminal of the first connector being electrically coupled with the first connecting terminal of the second connector when the first connector is coupled to the second connector.

4. The apparatus of claim 3, wherein:

the signal generation circuit is further configured to generate a second output signal at a second amplification gain and output the second output signal to the first connector, the first connector further comprises the first ring connecting terminal to which the second output signal is output, the first ring connecting terminal of the first connector being electrically coupled with the second connecting terminal of the second connector when the first connector is coupled to the second connector, and the controller is further configured to:
determine the second load resistance value at the second connecting terminal of the second connector, and
set the second amplification gain based on the second load resistance value.

5. The apparatus of claim 3, wherein:

the signal generation circuit comprises a first output channel and a second output channel, and the signal generation circuit is configured to:
output the first output signal at the first output channel; and
output a second output signal at the second output channel, the first connector further comprises the first ring connecting terminal to which the second output signal is output, the second connecting terminal of the first connector being electrically coupled with the second connecting terminal of the second connector when the first connector is coupled to the second connector, and the controller is further configured to:
determine whether the tip and the first ring terminals of the first connector are electrically shorted through the second connector; and
in response to a determination result indicating that the tip and first ring connecting terminals of the first connector are electrically shorted, set the second output channel to a high-resistance output mode.

6. The apparatus of claim 3, wherein the controller is further configured to determine that the tip connecting terminal of the first connector and the first connecting terminal of the second connector are electrically floating when the first load resistance value is greater than a predetermined threshold.

7. The apparatus of claim 2, wherein:

the signal generation circuit comprises:
a digital-to-analog converter (DAC) configured to generate an analog signal based on a digital signal; and
an analog amplifier configured to generate the first output signal based on the analog signal from the DAC, and the signal processing circuit is configured to set the first amplification gain by setting at least one of
a first parameter applicable to the DAC; and
a second parameter applicable to the analog amplifier.

8. The apparatus of claim 1, wherein the signal processing circuit is further configured to:
detect establishment of a connection between the first and second connectors, and
determine the first load resistance value and set the first amplification gain in response to detection of the establishment of the connection between the first and second connectors.

9. An apparatus, comprising:

an audio jack configured to receive an audio plug to couple a tin connecting terminal, a first ring connecting terminal, a second ring connecting terminal and a sleeve connecting terminal of the audio jack with respective portions of the audio plug;

an insertion detector configured to detect insertion of the audio plug into the audio jack;

a signal generation circuit configured to generate a first output signal based on a set of gain settings that are adjustable, and provide the first output signal to the audio plug via the audio jack;

a controller configured to, in response to detection of the insertion of the audio plug into the audio jack:
measure a first current-voltage (I-V) characteristic of the audio plug via the sleeve connecting terminal of the audio lack and a second I-V characteristic of the audio plug via the second ring connecting terminal of the audio jack;
determine a set of plural potential pole configurations for the audio plug based on the first I-V characteristic and the second I-V characteristic;
detect a first load resistance value at a first connecting terminal of the audio plug via the tip connecting terminal of the audio jack and a second load resistance value at a second connecting terminal of the audio plug via the first ring connecting terminal of the audio jack;
select a pole configuration from the set of plural potential pole configurations based on the first load resistance value and the second load resistance value; and
adjust the set of gain settings of the signal generation circuit based at least on the first load resistance value.

10. The apparatus of claim 9, wherein
the signal generation circuit is configured to generate a second output signal based on the set of gain settings; and
the controller is further configured to, in response to detection of the insertion of the audio plug into the audio jack:

adjust the set of gain settings of the audio signal generation circuit based on the second load resistance value.

11. The apparatus of claim 9, wherein
the signal generation circuit comprises a first output channel electrically coupled with the first connecting terminal of the audio plug and a second output channel electrically coupled with the second connecting terminal of the audio plug through the audio jack,
the signal generation circuit is configured to:
output the first output signal at the first output channel; and
output a second output signal at the second output channel, and
the controller is further configured to:
determine whether the first and second connecting terminals of the audio plug are electrically shorted; and
in response to a determination result indicating that the first and second connecting terminals of the audio plug are electrically shorted, set the second output channel to a high-resistance output mode.

12. The apparatus of claim 9, wherein the controller is further configured to determine that the first connecting terminal of the audio plug is electrically floating when the first load resistance value is greater than a predetermined threshold.

13. The apparatus of claim 9, wherein:
the signal generation circuit comprises:
a digital-to-analog converter (DAC) configured to generate an analog signal based on a digital signal; and
an analog amplifier configured to generate the first output signal based on the analog signal from the DAC, and
the controller is configured to adjust the set of gain settings by setting at least one of
a first parameter applicable to the DAC; and
a second parameter applicable to the analog amplifier.

14. A method, comprising:
detecting establishment of a connection between a first connector and a second connector, the first connector being configured to receive the second connector to couple a tip connecting terminal, a first ring connecting terminal, a second ring connecting terminal and a sleeve connecting terminal of the first connector with respective portions of the second connector; and
in response to detecting the establishment of the connection between the first and second connectors:
measuring a first current-voltage (I-V) characteristic of the second connector via the sleeve connecting terminal of the first connector and a second I-V characteristic of the second connector via the second ring connecting terminal of the first connector;
determining a set of plural potential pole configurations for the second connector based on the first I-V characteristic and the second I-V characteristic;
detecting a first load resistance value at a first connecting terminal of the second connector via the tip connecting terminal of the first connector and a second load resistance value at a second connecting terminal of the second connector via the first ring connecting terminal of the first connector;

selecting a pole configuration from the set of plural potential pole configurations based on the first load resistance value and the second load resistance value; and
setting a first amplification gain for generating a first output signal based on the first load resistance value.

15. The method of claim 14, further comprising:
in response to detecting the establishment of the connection between the first and second connectors,
setting a second amplification gain for generating a second output signal based on the second load resistance value.

16. The method of claim 14, further comprising:
in response to detecting the establishment of the connection between the first and second connectors,
determining whether the first connecting terminal and the second connecting terminal of the second connector are electrically shorted; and
in response to a determination result indicating that the first and second connecting terminals of the second connector are electrically shorted, setting an output channel of a signal generation circuit to an high-resistance output mode, the output channel of the signal generation circuit being configured to output a second output signal to the second connecting terminal of the second connector.

17. The method of claim 14, further comprising:
setting an output channel of a signal generation circuit to a high-resistance output mode, the output channel of the signal generation circuit being configured to output an output signal to a ground reference node of the second connector.

18. The apparatus of claim 1, wherein the signal processing circuit is further configured to:
determine the first I-V characteristic at the sleeve connecting terminal of the first connector by electrically coupling the second ring connecting terminal of the first connector with a ground reference; and
determine the second I-V characteristic at the second ring connecting terminal of the first connector by electrically coupling the sleeve connecting terminal of the first connector with the ground reference.

19. The apparatus of claim 9, wherein the controller is further configured to:
determine the first I-V characteristic at the sleeve connecting terminal of the audio jack by electrically coupling the ring second connecting terminal of the audio jack with a ground reference; and
determine the second I-V characteristic at the second ring connecting terminal of the audio jack by electrically coupling the sleeve connecting terminal of the audio jack with the ground reference.

20. The method of claim 14, further comprising:
determining the first I-V characteristic at the sleeve connecting terminal of the first connector by electrically coupling the second ring connecting terminal of the first connector with a ground reference; and
determining the second I-V characteristic at the second ring connecting terminal of the first connector by electrically coupling the sleeve connecting terminal of the first connector with the ground reference.

* * * * *